United States Patent [19]

Gillberg

[11] Patent Number: 4,525,635
[45] Date of Patent: Jun. 25, 1985

[54] TRANSIENT SIGNAL SUPPRESSION CIRCUIT

[75] Inventor: James E. Gillberg, Flemington, N.J.

[73] Assignee: RCA Corporation, Princeton, N.J.

[21] Appl. No.: 450,062

[22] Filed: Dec. 15, 1982

[51] Int. Cl.³ .................. H03K 17/56; H03K 19/00
[52] U.S. Cl. .................. 307/247 R; 307/247 A; 307/480; 307/234; 307/542
[58] Field of Search ............. 307/480, 58, 269, 520, 307/247 A, 247 R, 542, 543, 234

[56] References Cited

U.S. PATENT DOCUMENTS

| | | | |
|---|---|---|---|
| 3,611,158 | 10/1972 | Strathman | 307/234 |
| 3,725,792 | 4/1973 | Kellogg | 328/60 |
| 3,828,258 | 8/1974 | Hills et al. | 328/111 |
| 3,835,336 | 9/1974 | Block | 307/234 |
| 3,950,705 | 4/1976 | Fuerherm | 307/269 |
| 3,989,960 | 11/1976 | Kodama | 307/247 |
| 4,057,738 | 11/1977 | Nishimura | 307/247 A |
| 4,282,488 | 8/1981 | Norman et al. | 307/443 |

Primary Examiner—Stanley D. Miller
Assistant Examiner—B. P. Davis
Attorney, Agent, or Firm—Joseph S. Tripoli; George E. Haas; Henry I. Schanzer

[57] ABSTRACT

An input signal is applied to a first flip-flop whose output is coupled to the input of a second flip-flop. The two flip-flops are clocked, at a time $t_1$ and at a subsequent time $t_2$, for storing the value ($SI_1$) of the input signal at time $t_1$ in one flip-flop and for storing the value ($SI_2$) of the input signal at time $t_2$, in the other flip-flop. Logic gates coupled between the first and second flip-flops and a third, set/reset, flip-flop sense the values ($SI_1$ and $SI_2$) of the input signal stored by the first and second flip-flops and either: (a) set the third flip-flop to a condition indicative of the value of the input signal at times $t_1$ and $t_2$ if $SI_1$ is equal to $SI_2$; or (b) maintain the third flip-flop undisturbed in the state to which it was set just prior to $t_1$ if $SI_1$ is not equal to $SI_2$.

9 Claims, 5 Drawing Figures

TRANSIENT SIGNAL SUPPRESSION CIRCUIT

This invention relates to a digital means for sensing the duration of an input signal.

Input signals often contain erroneous, undesirable, or unuseable information which must be filtered. For example, when mechanical switches are closed, or opened, they tend to "bounce". The steady state value of signals generated by these switches is indeterminate for some period of time following the closing or opening of the switches since the signals have a rapidly and erratically changing characteristic immediately following the closing, or opening, of these switches. Likewise, signals generated in a very noisy electrical environment, such as that found within, or close to, an automobile engine, are subject to transients which alter the steady state value of the signals for a brief period of time. If a system responds to invalid signals present on an input line, erroneous functions may result. Thus, it is desirable and/or necessary that transient, noise or bounce present on an input line be filtered out of a system before the system responds to an erroneous input.

In a circuit embodying the invention, an input signal is coupled to first and second flip-flops. The two flip-flops are clocked at a time $t_1$ and at a subsequent time $t_2$, for storing the value ($SI_1$) of the input signal at time $t_1$ in one flip-flop and for storing the value ($SI_2$) of the input signal at time $t_2$, in the other flip-flop. Means are coupled between the first and second flip-flops and a third, set/reset, flip-flop for sensing the values ($SI_1$ and $SI_2$) of the input signal stored by the first and second flip-flops and for then either: (a) setting the third flip-flop to a condition indicative of the value of the input signal at times $t_1$ and $t_2$ if $SI_1$ is equal to $SI_2$; or (b) maintaining the third flip-flop undisturbed in the state to which it was set at, or just prior to, $t_1$ if $SI_1$ is not equal to $SI_2$.

Hence, in a circuit embodying the invention, an input signal to the circuit is sampled by digital techniques to determine its duration. If the signal duration is shorter than a predetermined sampling period, T, the signal is treated as noise and is filtered. If the duration, $T_s$, of the input signal spans the period T, it is treated as a valid signal and a corresponding output signal is produced at the circuit output.

In the accompanying drawing, like reference characters denote like components, and FIG. 1 is a logic diagram of a circuit embodying the invention;

The circuitry shown in the FIGURES makes use of various combinations of logic gates and flip-flops to perform logic and storing functions. These are shown by way of example only and any other logic gates or storage means which can perform the same or equivalent logic functions may be used instead.

In the discussion to follow it will be convenient to discuss operation in Boolean terms. The convention arbitrarily adopted is that the most positive voltage used in the system represents the binary digit 1 also called "high" or "hi" and the least positive voltage represents the binary digit 0 also referred to as "low" or "lo". To further simplify the explanation of the circuit operation, it will sometimes be stated that a "1" (high or hi) or a "0" (low or lo) is applied to a circuit or obtained from a circuit rather than stating that a voltage which is indicative of a 1 or 0 is applied to or derived from a circuit.

Figure 1:
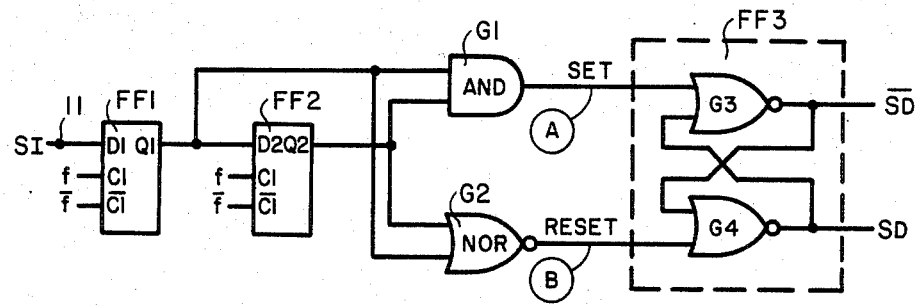
Figure 4A:
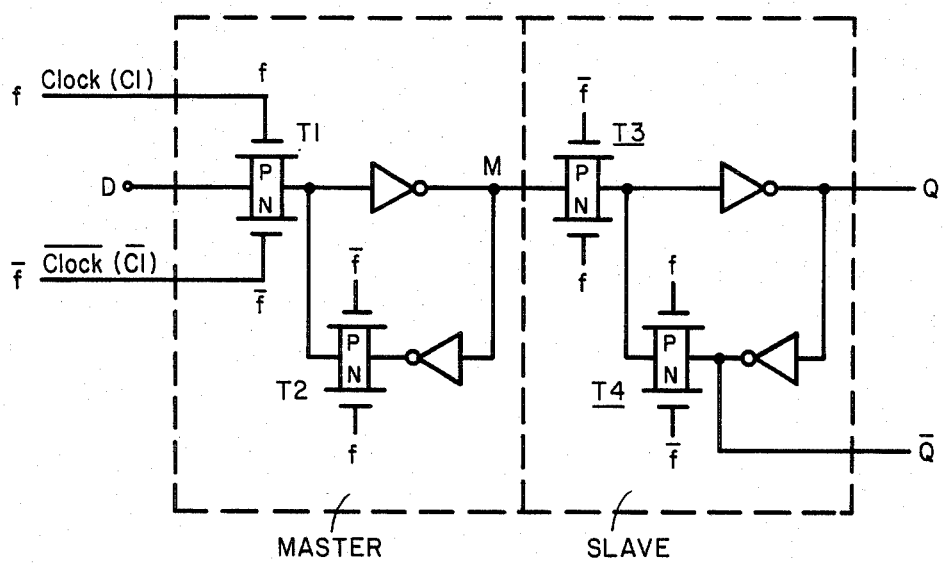
FIG. 4 is a diagram of a type of a clocked flip-flop which may be used in the circuit of FIG. 1.

The circuit of FIG. 1 includes two clocked-data flip-flops (ff1 and ff2), a two-input AND gate G1, a two-input NOR gate G2, and a set-reset flip-flop, ff3. Each one of flip-flops, ff1 and ff2, may be a D-type master-slave flip-flop of the type shown in FIG. 4A. Each one of ff1 and ff2 includes a data (D) input, a clock (C1) and a $\overline{clock}$ ($\overline{C1}$) input and two complementary outputs (Q and $\overline{Q}$). Complementary clock signals f and $\overline{f}$ are applied to the C1 and $\overline{C1}$ inputs, respectively, of ff1 and ff2. During the "negative" or "low" half-cycle of the f-clock, transmission gates T1 and T4 are turned-on and transmission gates T2 and T3 are turned-off as shown in FIG. 4A. The binary value of the input signal applied to the D-input is then transferred into the master section, while the slave section is isolated from the master section and remains set to its previous state. During the "positive" or "high" half cycle of the f-clock transmission gates T1 and T4 are turned-off and gates T2 and T3 are turned-on. The information previously stored in the master section is then transferred to the slave section while the master section is isolated from the input signal and remains set to its previous state.

Figure 4B:
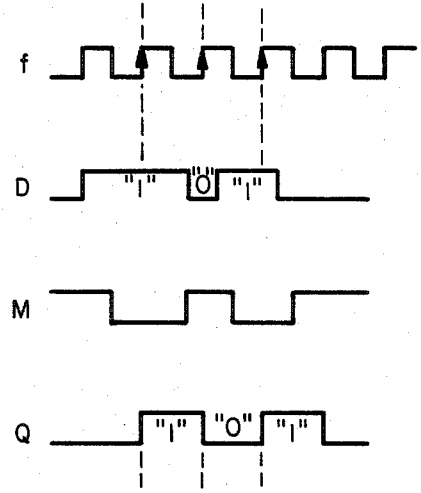

As shown in FIG. 4B, a signal (WAVEFORM D) present at the data-(D)-input of the flip-flop is transferred into the master portion (WAVEFORM M) of the flip-flop when the f-clock is low and is then stored in, and sets, the slave portion (WAVEFORM Q) of the flip-flop to a corresponding binary level when the f-clock goes positive. When f goes positive, the Q output assumes a binary value corresponding to the value of the input signal applied to the data input just prior to f going high, and the $\overline{Q}$ output assumes a value complementary to Q.

Referring back to FIG. 1, an input terminal 11, to which is applied an input signal, (SI), is connected to the D1 input of ff1. SI may be produced by a switch (not shown) or may be any one of a number of input signals which may have noise, bounce or jitter on their leading and/or trailing edges. Also, SI may change asynchronously with respect to the f-clock applied to ff1 and ff2. The output Q1 of ff1 is applied to the data input D2 of ff2. The outputs Q1 and Q2 are applied to the two inputs of AND gate G1 and to the two inputs of NOR gate G2. The output, A, of AND gate G1 is connected to the one input of ff3, arbitrarily designated the set input, and the output, B, of NOR gate G2 is connected to another input of ff3, arbitrarily designated the reset input. ff3 is comprised of two two-input NOR gates, G3 and G4, cross-coupled to form a set-reset flip-flop. In the circuit of FIG. 1, the output (SD) of gate G4 assumes the same binary value as a "valid input signal"; where, a "valid input signal", as discussed below, is a signal which is present for two or more positive-going f-clock transitions. The output ($\overline{SD}$) of gate G3 is the inverse of SD. Changes in $S_D$ and $\overline{S}_D$ occur in synchronism with a low-to-high transition of the f-clock.

Figure 2:
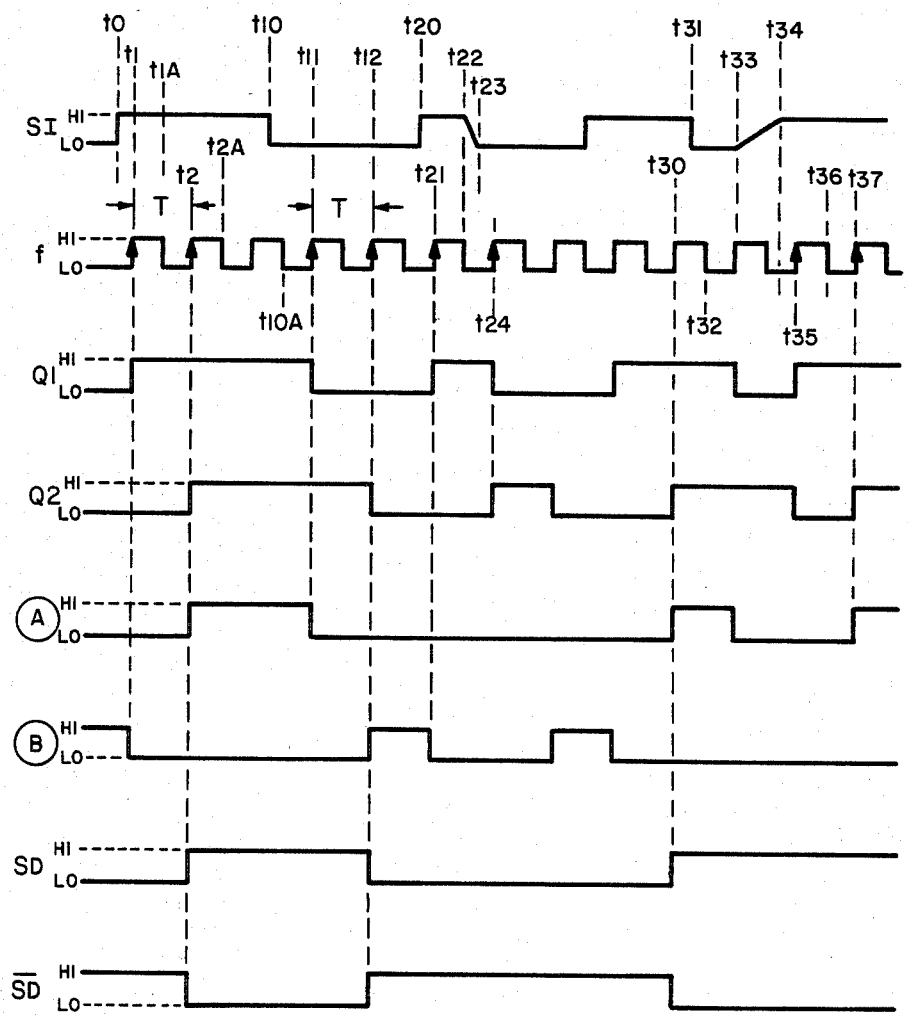
FIG. 2 is a diagram of waveforms showing the response of the circuit of FIG. 1 to various input signal conditions.

The operation of the circuit of FIG. 1 will first be outlined with a more detailed analysis to follow. In the circuit of FIG. 1, the input signal, SI, is effectively sampled on each positive going transistion of the f-clock. By way of example, assume as shown in FIG. 2, that the f-clock goes positive at times $t_1$ and $t_2$. When the f-clock goes positive, Q1 is set to the value (high or low) of the signal applied to D1 just prior to the f-clock going positive, and Q2 is set to the value (high or low) of the signal applied to D2 just prior to the f-clock going positive. Thus, at time $t_1$, Q1 is set to the value $SI_1$ of SI just prior to time $t_1$. Then at time $t_2$, Q2 is set to the value $SI_1$ while Q1 is set to the value $SI_2$ of SI just prior to time $t_2$. If $SI_1$ is equal to $SI_2$, then Q1=Q2 (both being high or both being low) and either of the two following conditions exists:

(1) If $SI_1 = SI_2 =$ low, then Q1=Q2=low. Consequently, the output A of gate G1 is low while the output B of NOR gate G2 is high. The set input to ff3 is then low and its reset input is then high whereby SD is set to the low level indicative of SI being low at $t_1$ and $t_2$;

(2) If $SI_1 = SI_2 =$ high, then Q1=Q2=high. Consequently, A, the set input, is high and, B, the reset input, is low causing SD to be set to the high level indicative of SI being high at $t_1$ and $t_2$.

For either of the two conditions above, the outputs (A & B) of gates G1 and G2 place (set or reset) ff3 so that SD is equal to the value (high or low) of $SI_1$ and $SI_2$.

If $SI_1$ is not equal to $SI_2$ (because $SI_1$ is high and $SI_2$ is low or, vice-versa, because $SI_1$ is low and $SI_2$ is high) then Q1 is not equal to Q2. Consequently, A is low and B is low. When A is low and B is low, set/reset ff3 remains undisturbed in the state to which it was previously set. Thus, a signal duration must be high or low for a sampling period ($t_1$-$t_2$) to be considered a valid signal and to be passed to the output (SD or $\overline{SD}$) of ff3.

The detailed operation of the circuit of FIG. 1 is best explained with reference to the waveforms shown in FIG. 2. Assume that SI, Q1 and Q2 are low prior to time $t_0$. Hence, A is low and B is high causing SD to be low and $\overline{SD}$ to be high.

Assume that, at time $t_0$, SI goes high while f is low. Since f is low, the "high" SI-input is stored in the master section of ff1 but Q1 and Q2 remain low until $t_1$. At time $t_1$, the f-clock goes from low-to-high causing Q1 to go from low-to-high while Q2 remains low. Consequently, A remains low while B goes from high-to-low in response to Q1 being high. The set (A) and reset (B) inputs to ff3 are now low, and ff3 remains in its previous state, (i.e. SD=low, $\overline{SD}$=high). When f goes low at time $t_{1A}$, the SI=high level is again fed into the master section of ff1 and the Q1=high level is fed into the master section of ff2. However, Q1 and Q2 remain high and low respectively until time $t_2$. Assume that SI remains high until time $t_2$ when f makes a second low-to-high transition. The high levels fed into the master sections of ff1 and ff2 cause, Q1 to remain high and Q2, which was low, to go high. With Q1 and Q2 at the high level, A goes high while B, which was low, continues low. With the set (A) input high and the reset (B) input low, the $\overline{SD}$ output of ff3 is driven low and the SD output goes high. Thus, on the second positive-going transition of the clock after SI went high, the circuit produces a high SD output indicative of SI being high for a minimum time interval $t_1$ to $t_2$.

When SI goes low and stays low for a period that spans two sampling pulses (positive-going transitions of the clock) SD goes low. Referring to FIG. 2, assume that, just prior to time $t_{10}$, Q1, Q2, and SI are high and that at $t_{10}$, SI goes low. The SI=low level is coupled into ff1 during the subsequent negative going clock cycle (between $t_{10A}$ and $t_{11}$) but Q1 does not change until time $t_{11}$ when f goes positive. Q1 then goes low while Q2 remains high. Q1-low causes A to go low, while Q2-high causes B to remain low. Hence, the set (A) and reset (B) inputs to ff3 are now low causing ff3 to remain in its previous state whereby SD is high and $\overline{SD}$ is low. Assume that SI which went low at $t_{10}$ remains low until time $t_{12}$ when f goes high for the second time since $t_{10}$. Q1 which was low, remains low and Q2, which was high, is now driven low. With Q1 and Q2 low, B is driven high while A remains low. The set (A) and reset (B) inputs of ff3 are now low and high, respectively, causing SD and $\overline{SD}$ to be driven low and high, respectively. Thus, the circuit produces a low SD output indicative of SI being low for a minimum span of time T which includes two positive-going f-clock transitions.

Any signal on the input line which does not have the same binary level for two consecutive sampling pulses is filtered out of the circuit. Referring to FIG. 2, assume that, just prior to time $t_{20}$, Q1, Q2 and SI are low and that SI goes high at time $t_{20}$. SI-high is fed into ff1 but Q1 remains low until the time $t_{21}$. At $t_{21}$ f goes high (for the first time after SI went high) and Q1 then goes high while Q2 remains low. B which was high, then goes low, while A, which was low, remains low. The set and reset inputs to ff3 are now low, whereby ff3 is undisturbed with SD and $\overline{SD}$ remaining low and high, respectively. Assume that SI decays back to zero at time $t_{23}$ prior to f going high at time $t_{24}$. Between $t_{23}$ and $t_{24}$, the low SI level is fed into the master section of ff1 while the high Q1 level was fed into the master section of ff2 between $t_{22}$ and $t_{24}$. But, Q1 remains high and Q2 remains low until time $t_{24}$. At $t_{24}$, f goes high, Q1 is driven low, and Q2 is driven high. But, with Q1 low and Q2 high, A and B remain low and ff3 remains in its previous condition with SD—low and $\overline{SD}$—high. Thus, a positive-going transient on the input signal line which does not span two positive going clock transitions, is filtered out of the circuit and the circuit remains set to the state it held prior to the transient.

In a similar manner, a negative going transient signal is also filtered out of the system. Referring to the waveforms of FIG. 2, assume that, just prior to $t_{31}$, Q1, Q2 and SI are high and that SI goes low at time $t_{31}$. For these initial conditions, A is high, B is low, SD is high and $\overline{SD}$ is low. When SI goes low at $t_{31}$ no change occurs in the circuit until time $t_{32}$ when f goes low. The low SI level is then fed into the master section of ff1. But, Q1 remains high until time $t_{33}$ when f goes positive. At $t_{33}$, Q1 goes low while Q2 remains high. When Q1 goes low, A goes low while B remains low due to Q2 being high. With A and B low, the outputs of ff3 remain in their previous state of SD=high and $\overline{SD}$=low. Assume now that the negative going transient decays back to the high level such that SI is again high at time $t_{34}$ sometime prior to $t_{35}$ when the f-clock goes high for the second time since $t_{31}$. Between $t_{34}$ and $t_{35}$, the SI=high level is transferred into the master section of ff1 while Q1=low is fed into the master section of ff2. At time $t_{35}$ when f1 goes positive, Q1 is set high and Q2 is set low. With Q1-high and Q2-low, A and B remain low and SD and $\overline{SD}$ remain set to the conditions they held prior to $t_{31}$ so that SD remains high and $\overline{SD}$ remains low. If SI remains high until time $t_{37}$ when f again goes positive, Q1 and Q2 will be driven high, A will go high, B will remain low while SD remains high and $\overline{SD}$ remains low.

It has thus been shown that a positive or a negative transient is filtered out of the circuit of FIG. 1.

Figure 3:
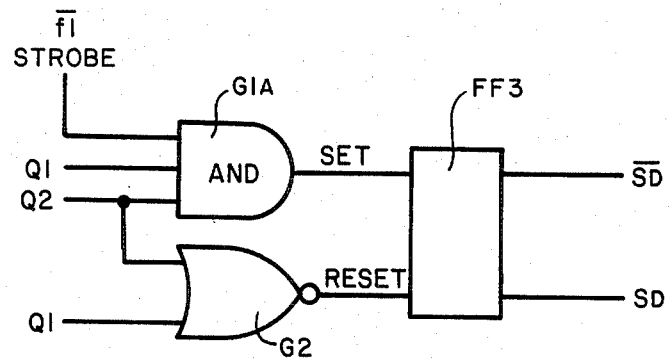
FIG. 3 is a logic diagram of a strobing arrangement useful with the circuit of FIG. 1.

The low-to-high transition of SD may be delayed by one-half cycle by strobing the AND gate G1 with a signal $\overline{f1}$ as shown in FIG. 3. This delay does not otherwise significantly alter the operation of the circuit. When either one or both Q1 and Q2 are low, the output A of the AND gate remains low. When Q1 and Q2 are both high, A varies in conjunction with $\overline{f1}$. However, as noted above, once A goes high (with B low) the flip-flop is set to the SD-high condition. If subsequently A alternates (goes repeatedly low and high), SD still remains high (unchanged) as long as B remains low.

This feature is useful in a system where several input lines which are being filtered, as shown in FIG. 1, are present and where their filtered outputs are being combined. It is desirable that no glitch be produced when, for example, the SD of one circuit goes from high-to-low while the SD of another circuit goes from low-to-high. By delaying the low-to-high transition of SD, the glitch problem is eliminated.

The invention has been illustrated using two clocked flip-flops, a set/reset flip-flop, an AND gate, and a NOR gate. However, it should be evident that other types of flip-flops and logic gates performing similar functions could be used instead.

What is claimed is:

1. The combination comprising:
   an input terminal adapted to receive an input signal;
   means comprising first and second flip-flops coupled to said input terminal for storing in said second flip-flop a signal ($SI_1$) corresponding to the value of said input signal at a time $t_1$, and for storing in said first flip-flop a signal ($SI_2$) corresponding to the value of said input signal at a time $t_2$, where $t_2$ is subsequent to $t_1$ and the interval $t_1$ to $t_2$ defines a sampling interval;
   a set/reset flip flop; and
   means, coupled between said first and second flip-flops and said set/reset flip-flop, responsive to the signals stored in said first and second flip flops for: (a) placing said set/reset flip-flop in a condition indicative of the value of the input signal stored in said first and second flip-flops when $SI_1$ is equal to $SI_2$; and (b) maintaining said set/reset flip-flop in the condition it had prior to $t_1$ when $SI_1$ is not equal to $SI_2$.

2. The combination as claimed in claim 1 wherein each one of said first and second flip-flops includes a data input, a data output, and a clock input;
   wherein the data input of said first flip-flop is connected to said input terminal, and wherein the data output of said first flip-flop is connected to the data input of said second flip-flop; and
   wherein sampling signals comprising a clock signal are applied to said clock input of said first and second flip flops.

3. The combination as claimed in claim 2 wherein said set/reset flip-flop has a set input, a reset input, and a signal output; and
   wherein said means coupled between said first and second flip flops and said set/reset flip-flop includes a first logic gate connected between the data outputs of said first and second flip-flop and said set/reset, and a second logic gate connected between the data outputs of said first and second flip-flop and said set/reset input.

4. The combination as claimed in claim 3 wherein one of said first and second logic gates includes means responsive to a strobing signal for controlling the point in time when the output of said one of said first and second logic gates places the set/reset flip-flop to a desired condition.

5. The combination comprising:
   an input terminal adapted to receive an input signal;
   first and second clocked master-slave flip-flops, each flip-flop having a data input, a data output, and a clock input;
   means connecting said input terminal to said data input of said first flip flop;
   means connecting said data output of said first flip-flop to said data input of said second flip-flop;
   means for applying sampling signals to said clock inputs of said first and second flip-flops;
   a set/reset flip-flop having a set input, a reset input, and a signal output;
   comparing means, connected between said data outputs of said first and second flip-flops and the set and reset inputs of said set/reset flip-flop responsive to the binary values of said data outputs for placing said set/reset flip-flop in the set condition when the data outputs of said first and second flip flops are at the same one binary level and placing the set/reset flip-flop in the reset condition when the data outputs of said first and second flip-flops are at the same, other binary level, and for maintaining said set/reset flip-flop undisturbed when the binary values at the data outputs of said first and second flip-flops are not the same.

6. The combination as claimed in claim 5 wherein each one of said first and second flip-flops is responsive to a first phase of said sampling signals applied to its clock input for transferring information from its data input into its master section and to a second phase of said sampling signals for transferring the information from its master section to its slave section and to its data input.

7. The combination as claimed in claim 6 wherein said comparing means includes a first logic gate connected between said data outputs of said first and second flip-flops and said set input for providing an AND type function; and a second logic gate connected between said data outputs of said first and second flip-flops and said reset-input for producing a NOR type function.

8. A circuit for producing an output signal of first significance in response to an input signal having a first value for a period greater than T and for producing an output signal of second significance in response to an input signal having a second value for period greater than T, where said period T is defined by the occurrence of a first sampling signal at time $t_1$ followed by a second sampling signal at time $t_2$, comprising:
   first and second flip-flops, each flip-flop having a data input, a clock input, and an output terminal;
   means for applying said input signal to the data input of said first flip-flop;
   means coupling the data input of said second flip-flop to the data output of said first flip-flop;
   means for applying sampling signals to the clock inputs of said first and second flip-flops at time $t_1$ and subsequently at time $t_2$ for storing the value of the input signal at time $t_1$ in one of said first and second flip-flops and for storing the value of the input signal at time $t_2$ in the other one of said first and second flip-flops;

a set/reset flip-flop having a set-input, a reset-input, and at least one output terminal; and means, coupled between the output terminals of said first and second flip-flops and the set and reset inputs of said set/reset flip-flops, responsive to the contents stored in said first and second flip-flop for either: (a) placing said set/reset flip-flop in the set state or in the reset state corresponding to the input signal being at said first value or at said second value for the interval $t_1$-to-$t_2$; or (b) maintaining the state of the set/reset flip-flop undisturbed when the input signal at $t_2$ has a different value than at $t_1$.

9. The combination as claimed in claim 1 wherein said sampling interval is a fixed period.

* * * * *

UNITED STATES PATENT AND TRADEMARK OFFICE
CERTIFICATE OF CORRECTION

PATENT NO. : 4,525,635

DATED : Jun. 25, 1985

INVENTOR(S) : James E. Gillberg

It is certified that error appears in the above-identified patent and that said Letters Patent is hereby corrected as shown below:

Col. 7, line 6, change "flip-flop" to - - - flip-flops - - -.

Signed and Sealed this

Twenty-second Day of October 1985

[SEAL]

Attest:

DONALD J. QUIGG

Attesting Officer

Commissioner of Patents and
Trademarks—Designate